(12) United States Patent
Visser et al.

(10) Patent No.: US 8,699,619 B2
(45) Date of Patent: Apr. 15, 2014

(54) DUTYCYCLE ADJUSTMENT TO IMPROVE EFFICIENCY OF A DIGITAL RF-PA

(75) Inventors: Hendrik Visser, Wijchen (NL); Roeland Heijna, Nijmegen (NL); Norbert Van Den Bos, Wijchen (NL)

(73) Assignee: Ericsson Modems SA, Plan-les-Ouates (CH)

( * ) Notice: Subject to any disclaimer, the term of this patent is extended or adjusted under 35 U.S.C. 154(b) by 754 days.

(21) Appl. No.: 12/941,216

(22) Filed: Nov. 8, 2010

(65) Prior Publication Data

US 2012/0081179 A1  Apr. 5, 2012

Related U.S. Application Data

(60) Provisional application No. 61/388,209, filed on Sep. 30, 2010.

(51) Int. Cl.
- *H04K 1/02* (2006.01)
- *H04L 25/03* (2006.01)
- *H04L 25/49* (2006.01)

(52) U.S. Cl.
USPC .......................................... 375/297; 330/251

(58) Field of Classification Search
USPC .......................................... 375/297; 330/251
See application file for complete search history.

(56) References Cited

U.S. PATENT DOCUMENTS

| | | | |
|---|---|---|---|
| 5,963,071 A * | 10/1999 | Dowlatabadi | 327/175 |
| 6,060,922 A | 5/2000 | Chow et al. | |
| 6,304,124 B1 | 10/2001 | Mizuno | |
| 6,882,196 B2 * | 4/2005 | Yee et al. | 327/175 |
| 7,250,802 B2 | 7/2007 | Lin | |
| 7,612,592 B2 * | 11/2009 | Parikh | 327/175 |
| 7,724,079 B1 * | 5/2010 | Shumarayev | 330/9 |
| 8,054,908 B2 * | 11/2011 | Nakasha et al. | 375/295 |
| 2002/0180547 A1 | 12/2002 | Staszewski et al. | |
| 2007/0024338 A1 * | 2/2007 | Shumarayev et al. | 327/175 |
| 2009/0091384 A1 * | 4/2009 | Sorrells et al. | 330/207 R |
| 2011/0129037 A1 * | 6/2011 | Staszewski et al. | 375/316 |

FOREIGN PATENT DOCUMENTS

| | | |
|---|---|---|
| EP | 2333950 A2 | 6/2011 |
| WO | 2009005768 A1 | 1/2009 |
| WO | 2010052668 A1 | 5/2010 |

OTHER PUBLICATIONS

Özen, M., et al., "High-Efficiency RF Pulsewidth Modulation of Class-E Power Amplifiers", IEEE Transactions on Microwave Theory and Techniques, Nov. 1, 2011, pp. 2931-2942, vol. 59, Issue: 11, IEEE Microwave Theory and Techniques Society.

\* cited by examiner

*Primary Examiner* — Shuwang Liu
*Assistant Examiner* — Nader Bolourchi
(74) *Attorney, Agent, or Firm* — Coats & Bennett, P.L.L.C.

(57) ABSTRACT

An amplification unit reduces a duty cycle of a digital signal at a carrier radio frequency to optimize the efficiency of the RF power amplifier that amplifies the reduced duty cycle signal. An exemplary amplification unit includes a duty cycle controller and a digital power amplifier. A delay unit in the duty cycle controller applies a delay to an input digital signal at the carrier radio frequency to generate a delayed signal at the carrier radio frequency. A logic gate in the duty cycle controller logically combines the input digital signal with the delayed signal to generate a modified digital signal at the carrier radio frequency, where the modified input digital signal has a reduced duty cycle relative to that of the input digital signal. Amplifying the modified digital signal in the digital RF power amplifier generates an amplified analog signal at the carrier radio frequency while improving amplifier efficiency.

17 Claims, 13 Drawing Sheets

DUTYCYCLE ADJUSTMENT TO IMPROVE EFFICIENCY OF A DIGITAL RF-PA

This application claims priority to Provisional U.S. Patent Application 61/388,209 filed 30 Sep. 2010, which is incorporated herein by reference.

BACKGROUND

Current wireless technology trends increasingly favor smaller devices, implementations of which generally require some digital components. For example, class D and class F amplifiers are switching amplifiers that provide a digital amplification option for analog inputs. These amplifiers require harmonic tuning networks, which are bulky, and are therefore difficult to integrate on a digital chip. Further, such tuning networks generally must be operated at frequencies below 300 MHz due to parasitic limitations. Thus, such switching amplifiers are problematic for wireless telecommunication frequency applications, which are generally between 900 MHz and 5.8 GHz.

Another option is the use of digital radio frequency (RF) power amplifiers. In this case, the input is digital, and thus no analog matching network is used. The clock frequency of the digital signal sets the carrier radio frequency by toggling between "0" and "1" at a desired speed. Conventional digital RF power amplifiers, however, are inefficient. Further, the efficiency of such digital RF power amplifiers cannot be controlled with conventional biasing and/or harmonic matching techniques. Thus, there remains a need for alternative solutions that are compatible with small chip designs and have improved efficiency.

SUMMARY

Embodiments described herein adjust, e.g., reduce, a duty cycle of a digital signal at a carrier radio frequency before amplification to optimize the efficiency of the power amplifier used to amplify the input digital signal. An exemplary amplification unit includes a duty cycle controller and a digital power amplifier. The duty cycle controller applies duty cycle control to the input digital signal using a delay unit and a logic gate to generate a modified digital signal at the carrier radio frequency. The delay unit applies an analog delay to the input digital signal at the carrier radio frequency to generate a delayed signal at the carrier radio frequency. The logic gate logically combines the input digital signal with the delayed signal to generate the modified digital signal, where the modified input digital signal has an adjusted duty cycle relative to that of the input digital signal. The digital power amplifier amplifies the modified digital signal to generate an amplified analog signal at the carrier radio frequency. In so doing, the amplification unit improves the efficiency of the digital power amplifier. Embodiments described herein also include a method implementing the process steps associated with the amplification unit.

DETAILED DESCRIPTION

Embodiments described herein control the efficiency of a digital RF power amplifier using duty cycle control of the carrier radio frequency. As used herein, the term "carrier radio frequency" refers to frequencies used for wireless communications. Further, those skilled in the art understand that the term "duty cycle" refers to the ratio between the time $\tau$ the signal is "1" (e.g., at a logic high level) and the signal period T, and may be mathematically represented by $D=\tau/T$. Conventional duty cycle control techniques require oversampling a signal before adjusting the duty cycle. For example, the duty cycle of a 1 MHz signal may be controlled by first oversampling the 1 MHz signal, e.g., to generate a 100 MHz signal, and then suppressing cycles of the 100 MHz signal to control the duty cycle. However, such conventional techniques are not applicable to carrier radio frequencies, e.g., 900 MHz to 5.8 GHz, used for wireless telecommunications because oversampling such high speed signals is not generally possible with today's technology. The present invention overcomes this difficulty by providing duty cycle control that adjusts the duty cycle of a digital signal at the carrier radio frequency without oversampling. It will be appreciated that the desired duty cycle of the digital signal input to the amplifier may be determined based on the amplifier supply voltage, particular characteristics of the amplifier, the operating carrier radio frequency, expected and/or measured environmental conditions, and/or customer preferences.

Figure 1:
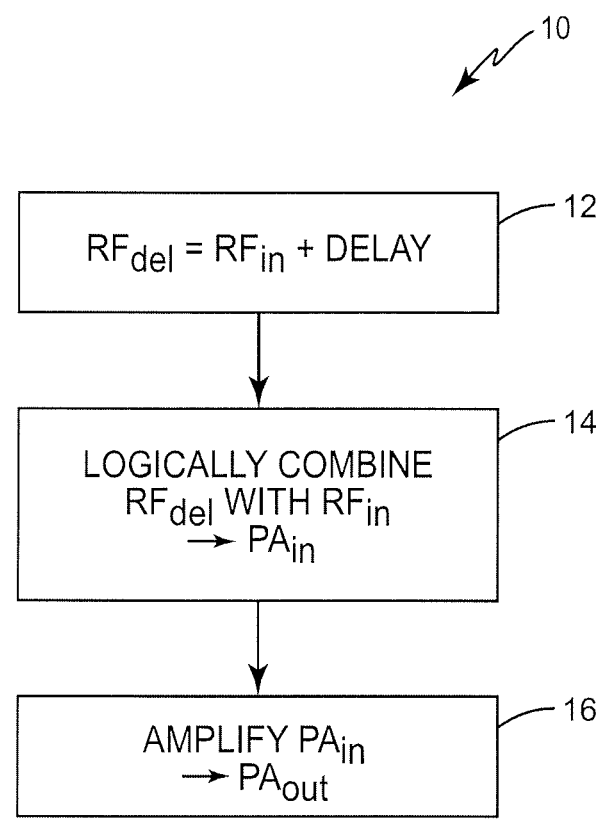
FIG. 1 is a method of improving the amplifier efficiency using duty cycle control according to one exemplary embodiment.

FIG. 1 shows an exemplary method 10 for improving the efficiency of a digital RF power amplifier using duty cycle control. The exemplary method 10 includes applying an analog delay to an input digital signal ($RF_{in}$) at a carrier radio frequency to generate a delayed signal ($RF_{del}$) at the carrier radio frequency (block 12), and logically combining RFin and RFdel to generate a modified digital signal $PA_{in}$ at the carrier radio frequency (block 14). The result of the logical combination is that the duty cycle of $PA_{in}$ differs from that of $RF_{in}$. The amplifier efficiency is increased by amplifying $PA_{in}$ (instead of $RF_{in}$) to generate an amplified analog signal $PA_{out}$ at the carrier radio frequency. (block 16).

Figure 2:
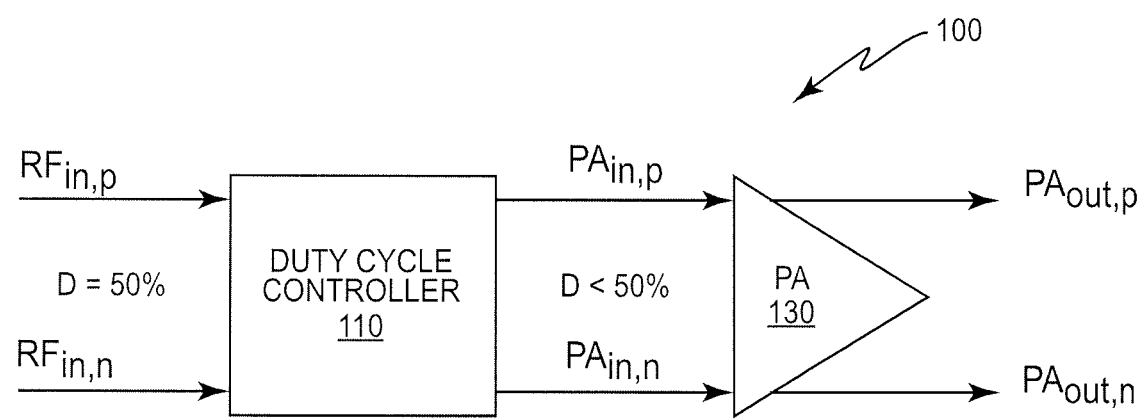
FIG. 2 is a block diagram of an amplification unit according to one exemplary embodiment.

FIG. 2 shows an exemplary amplification unit 100 comprising a duty cycle controller 110 and a digital power amplifier 130, where both operate at the carrier radio frequency. For simplicity, the embodiments disclosed herein are generally described in terms of a voltage-to-current differential amplifier. The duty cycle control described herein, however, also applies to current-to-current differential amplifiers and single-ended amplifiers.

Duty cycle controller 110 manipulates an input digital signal ($RF_{in}$) at the carrier radio frequency to generate a modified digital signal ($PA_{in}$) at the carrier frequency, wherein $PA_{in}$ has an adjusted duty cycle relative to that of $RF_{in}$. For example, the duty cycle controller 110 may manipulate an input digital signal having a 50% duty cycle to generate a modified digital signal having a duty cycle less than 50%. In one exemplary embodiment, the modified digital signal has a duty cycle between 20% and 30%.

Figure 3:
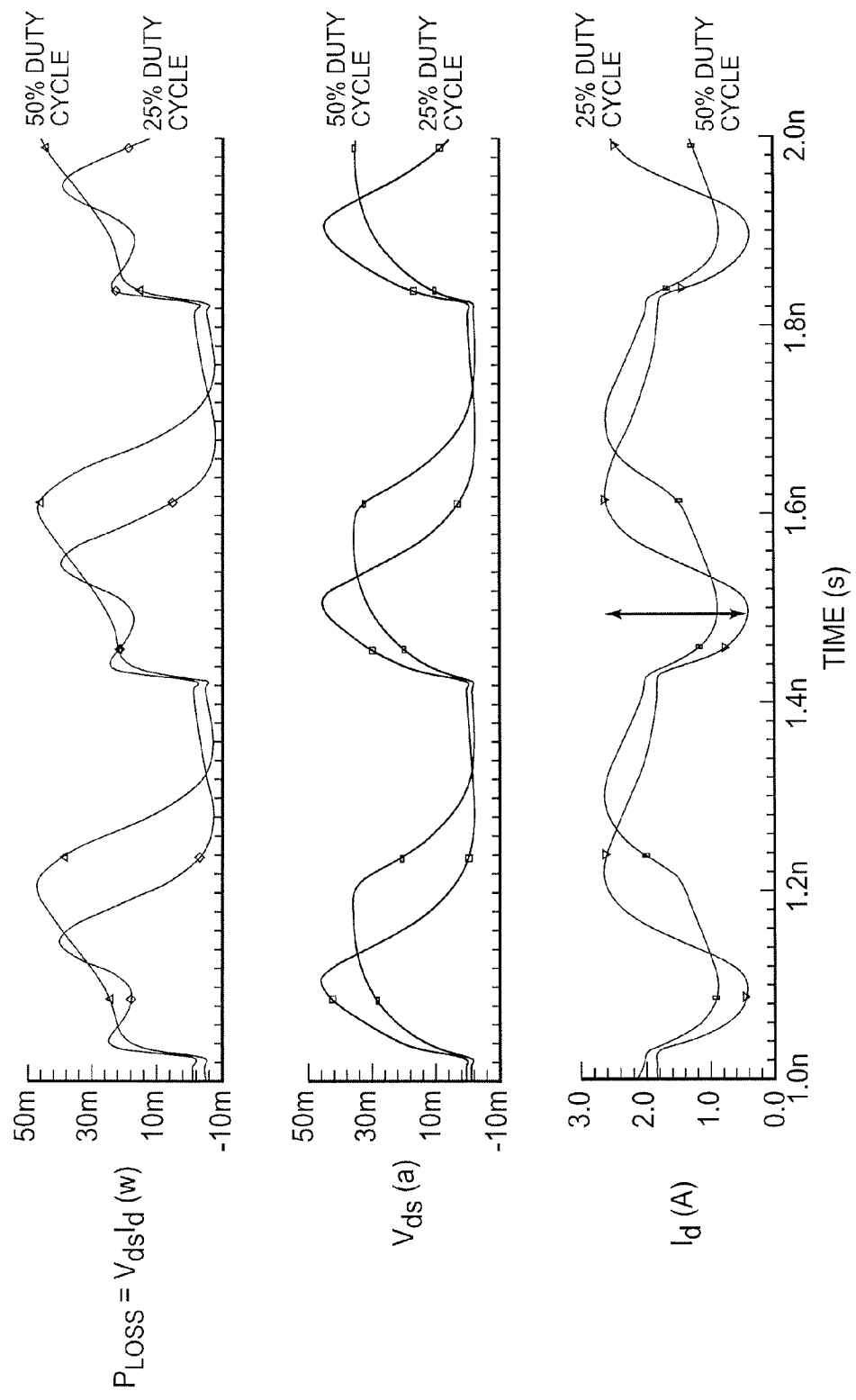
FIG. 3 depicts plots of voltage, current, and power loss for digital carrier frequency signals having a 50% duty cycle and a 25% duty cycle.

Digital power amplifier 130 amplifies the modified digital signal to generate an amplified analog signal ($PA_{out}$) at the carrier radio frequency. In some embodiments, $PA_{out}$ corresponds to the output radio frequency signal $RF_{out}$ that will be transmitted over a wireless interface to a remote device. In other embodiments, $RF_{out}$ is derived from $PA_{out}$. In any event, because digital power amplifiers rely on switching (e.g., on/off) circuits, controlling the duty cycle of the digital input controls the switching of the digital power amplifier, which in turn controls the amplifier efficiency, as shown in FIG. 3. The plots in FIG. 3 show an exemplary amplifier voltage $V_{ds}$ and amplifier current $I_d$, and the corresponding power loss $P_{loss}$ over time when an amplifier amplifies a 50% duty cycle digital signal and when the same amplifier amplifies a 25% duty cycle digital signal, where in both cases the output power is the same. In this example, the amplifier uses MOSFET technology to amplify the input signal, where $I_d$ represents the drain current and $V_{ds}$ represents the voltage across the drain and source of the transistor. As shown in FIG. 3, amplifying a 25% duty cycle signal in the digital power amplifier 130 significantly reduces $P_{loss}$ relative to when the amplifier 130 amplifies the 50% duty cycle signal.

FIG. 3 also shows that reducing the duty cycle also increases the peak-to-peak $V_{ds}$. To compensate for this without negatively impacting the $P_{loss}$ results, the amplifier load impedance may be adjusted. For example, if the voltage has increased/decreased due to the duty cycle change, the amplifier load impedance may be decreased/increased to ensure the same output power is provided. Changing the amplifier load impedance also impacts the efficiency. Thus, the amplification unit 100 may further improve the amplifier performance by finding a balance between the duty cycle, which impacts amplifier efficiency, and an amplifier load impedance, which impacts the output power and efficiency, to provide an optimum efficiency for a given output power, supply voltage, carrier radio frequency, environmental condition(s), and/or customer preference(s).

Figure 4A:
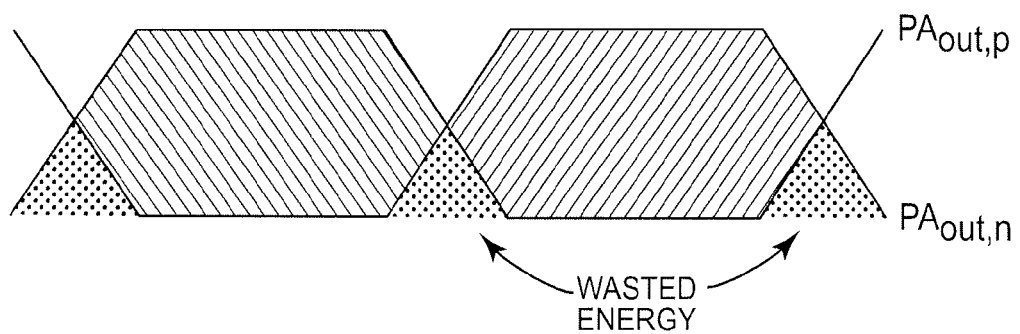
FIGS. 4A-4B are graphs of the different output signals for a differential power amplifier subject to inputs having different duty cycles.
Figure 4B:
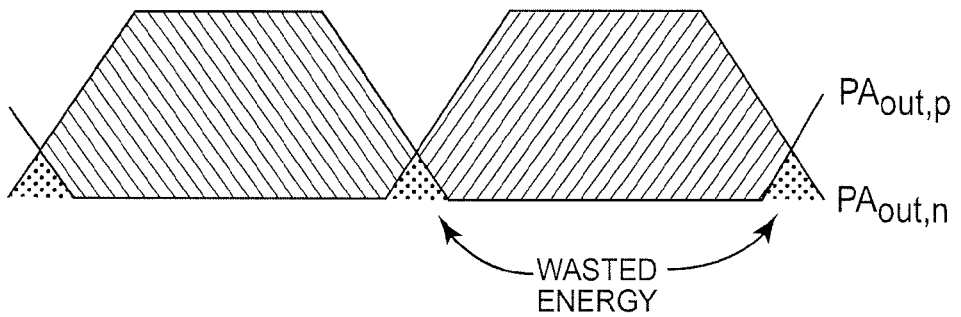

When digital power amplifier 130 comprises a differential power amplifier, as shown in FIG. 2, such efficiency improvements result in a reduced overlap between the inverting and non-inverting output signals, as shown in FIGS. 4A and 4B. FIG. 4A shows the inverting and non-inverting output analog signals $PA_{out,p}$, $PA_{out,n}$ when the digital amplifier input signal has a 50% duty cycle. Because the fall/ramp down time of $PA_{out,p}$ (or $PA_{out,n}$) is significantly slower than the rise/ramp up time of $PA_{out,n}$ (or $PA_{out,p}$), $PA_{out,p}$ and $PA_{out,n}$ overlap for some amount of time. During this overlap, the inverting and non-inverting amplifier elements draw current at the same time, causing the amplifier to dissipate power without contributing to the analog output signal power. Thus, the overlap shown in FIG. 4A indicates wasted energy and/or amplifier inefficiency.

As shown in FIG. 4B, reducing the duty cycle of the digital signal applied to the input of the amplifier as described herein reduces the signal overlap to improve amplifier efficiency. It will be appreciated that when amplification unit 100 includes a differential digital power amplifier 130, the same duty cycle control is applied to both the inverting and non-inverting inputs so that the inverting and non-inverting inputs have the same duty cycle. This may be achieved, for example, by using separate but dependently controlled duty cycle controllers 110 for each of the inverting and non-inverting inputs. For simplicity, however, the following describes a single duty cycle controller 110.

Figure 5:
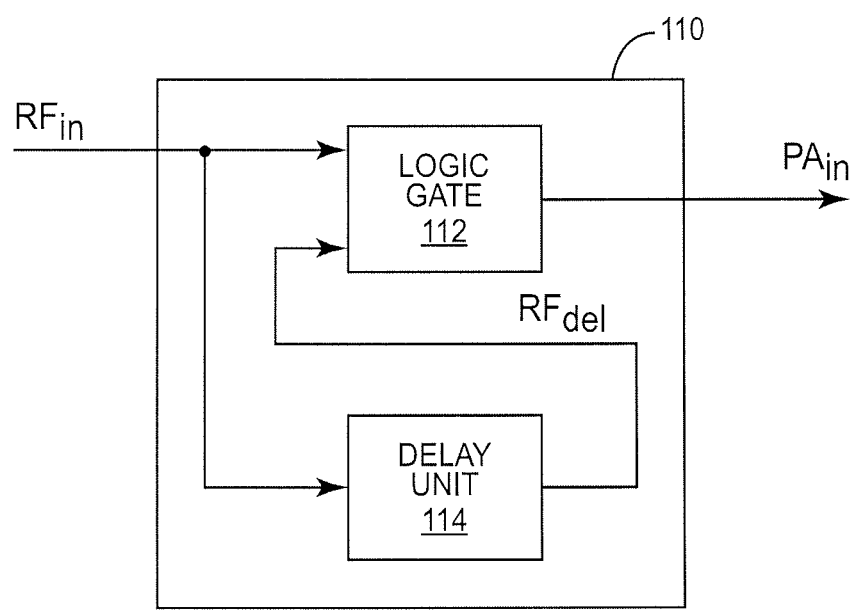
FIG. 5 is a block diagram of a duty cycle controller according to one exemplary embodiment.

FIG. 5 shows an exemplary duty cycle controller 110 comprising a logic gate 112 and a delay unit 114. Delay unit 114 applies an analog delay to the digital input signal $RF_{in}$ to generate a delayed signal $RF_{del}$. Logic gate 112 logically combines $RF_{in}$ and $RF_{del}$ to generate the modified digital signal $PA_{in}$ having a reduced duty cycle relative to that of $RF_{in}$.

Figure 6:
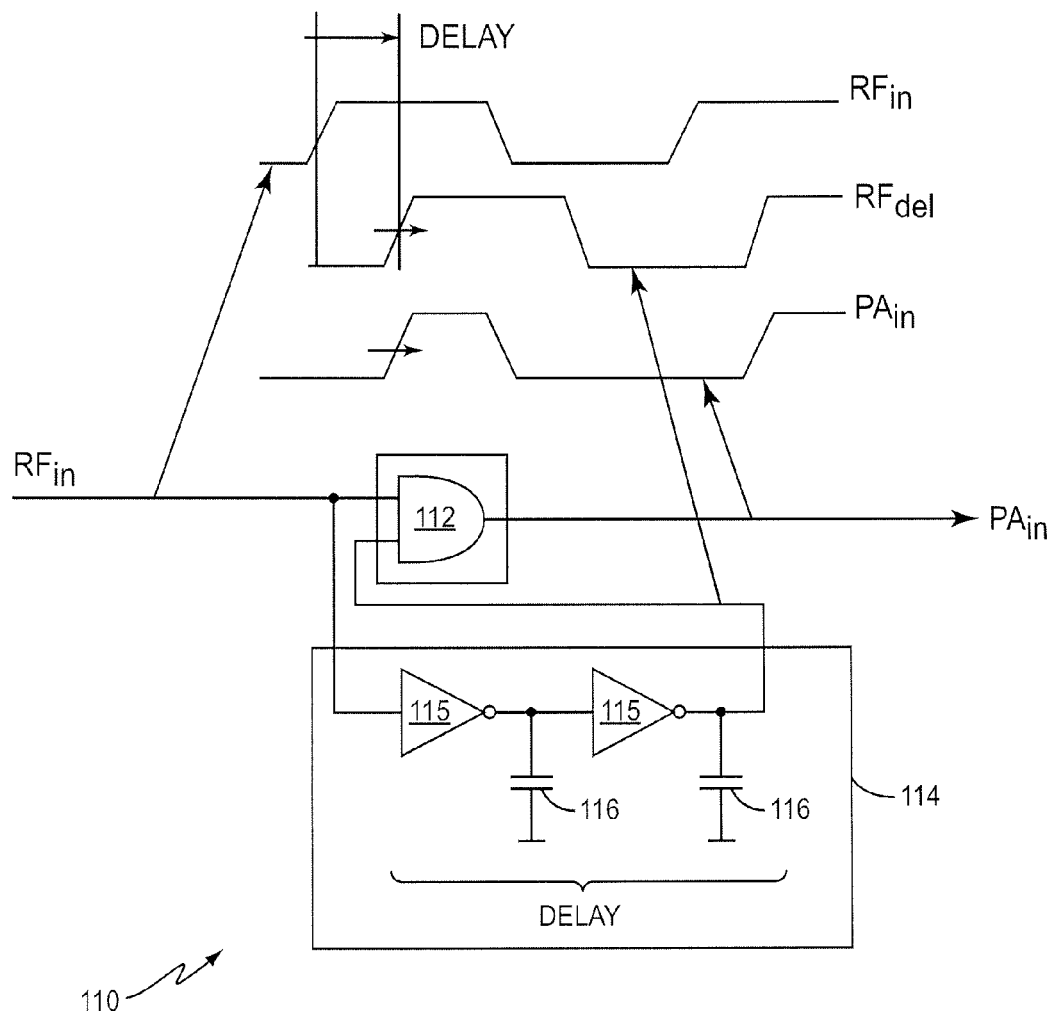
FIG. 6 is a circuit diagram for a duty cycle controller according to one exemplary embodiment.

FIG. 6 shows circuit details for one example of a duty cycle controller 110. In this embodiment, logic gate 112 comprises a logic AND gate 112, and delay unit 114 comprises two inverters 115 and two fixed capacitors 116. It will be appreciated that each of the capacitors 116 may have the same or different capacitance values. The capacitance values and/or the number of inverters 115 and capacitors 116 depends on the desired length of the delay to be imposed on RF, to generate the delayed signal $RF_{del}$, which depends on the desired duty cycle for the modified digital signal. As shown in the signal diagram above the illustrated duty cycle controller 110, the modified digital signal $PA_{in}$ has a reduced duty cycle (e.g., <50%) relative to the 50% duty cycle of the input digital signal ($RF_{in}$).

Figure 7:
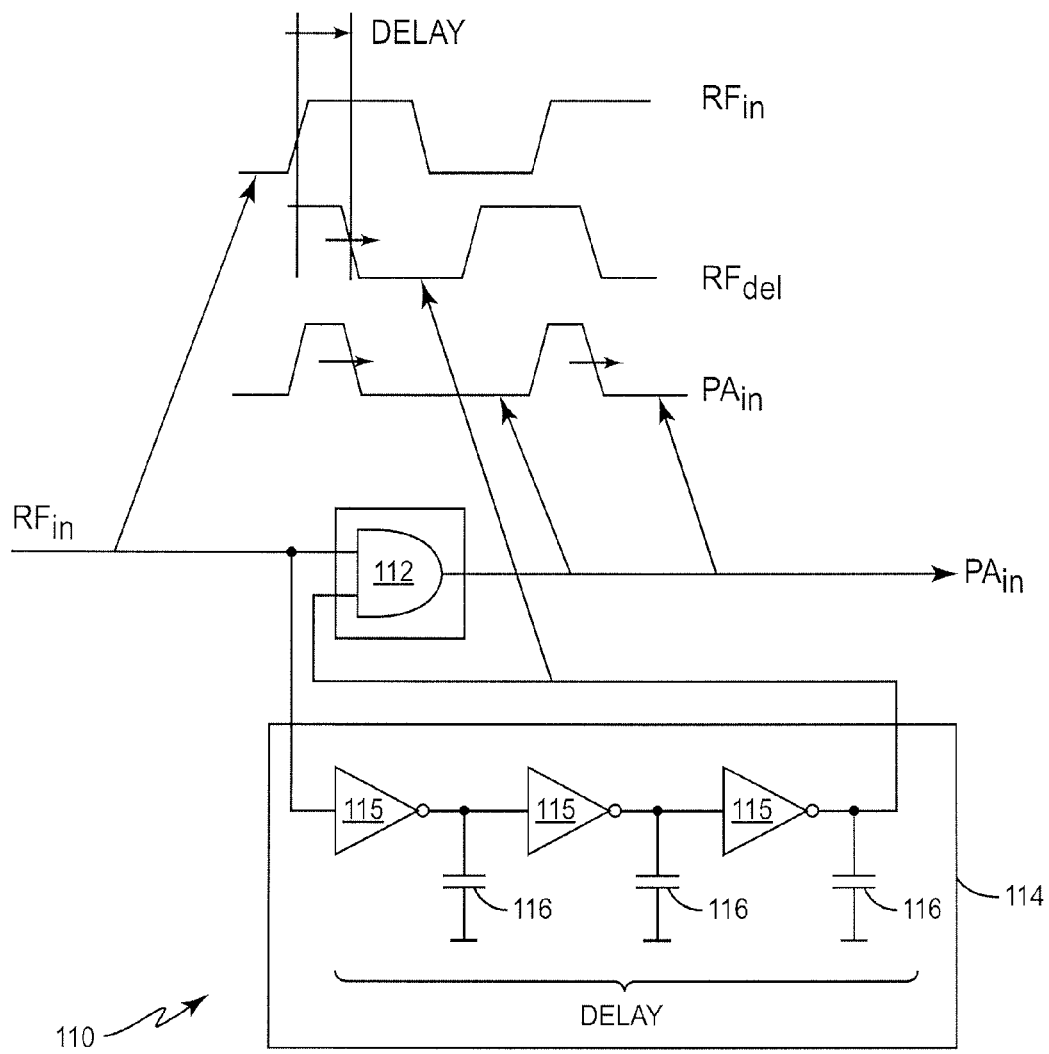
FIG. 7 is a circuit diagram for a duty cycle controller according to another exemplary embodiment.

The present invention does not require the logic gate 112 to be a logic AND gate 112, as shown in FIG. 6. Other logic gates, e.g., a logic OR, NOR, or NAND gate may be used. For example, FIG. 7 shows a duty cycle controller 110 that uses a logic NAND gate 112 along with three inverters 115 and the corresponding capacitors 116. It will further be appreciated that the different delay circuits of FIGS. 6 and 7 achieve the desired duty cycle using different approaches. In particular, the tuning range is inverted for the three inverter solution due to the logic NAND gate 112. Thus, the logic AND solution of FIG. 6 reduces the duty cycle of $PA_{in}$ by increasing the delay, while the logic NAND solution of FIG. 7 reduces the duty cycle of $PA_{in}$ by reducing the delay.

The type of logic gate 112 and the length of the delay is selected based at least in part on the desired duty cycle of the modified digital signal $PA_{in}$ and the desired noise performance. For example, the duty cycle controller 110 of FIG. 7 provides better phase noise performance when the desired duty cycle is less than 25%, while the duty cycle controller 110 of FIG. 6 provides better phase noise performance when the desired duty cycle is greater than 25%.

While FIGS. 6 and 7 show a delay unit 114 that uses fixed capacitors 116 imparting a fixed analog delay to the input, the present invention may alternatively use a delay unit 114 having a digitally controlled variable delay that imparts a variable analog delay to the input. Such a variable delay unit 114 enables the duty cycle controller 110 to achieve an accurate duty cycle for a wide range of radio frequencies, environmental conditions, capacitor tolerances, supply voltages, customer preferences, etc. It will be appreciated that the number of inverters used in the variable delay solution is selected based on the same factors discussed above for the fixed delay solution. By using digitally controlled analog delays, the duty cycle controller 110 may adjust the duty cycle in small steps, e.g., 1% to 5% steps.

Figure 8:
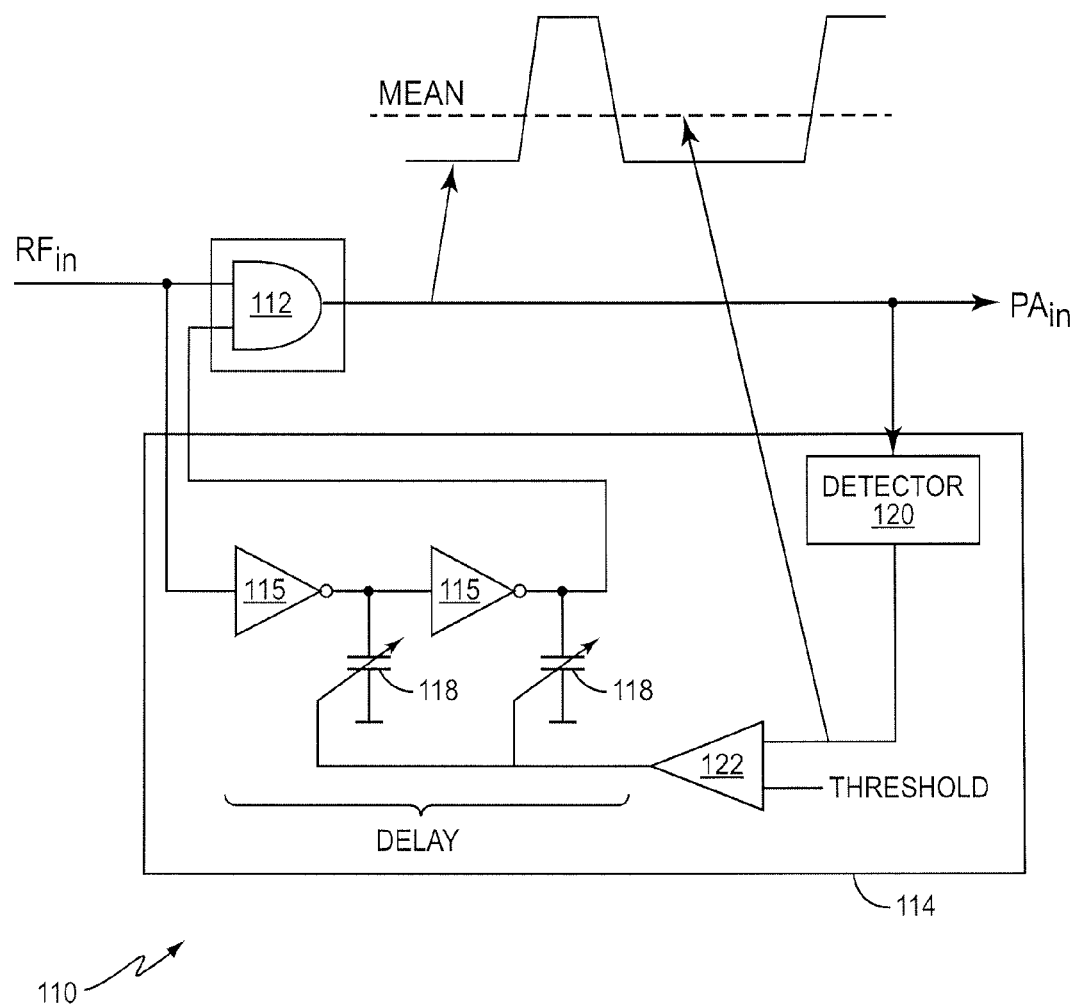
FIG. 8 is a circuit diagram for a duty cycle controller according to another exemplary embodiment.

FIG. 8 shows one exemplary variable duty cycle controller 110 having a variable delay unit 114. In this scenario, the variable delay unit 114 includes inverters 115, variable capacitors 118, a detector 120, and a comparator 122. The detector 120 detects a low frequency component of the modified digital signal $PA_{in}$, and the comparator 122 compares the detected low frequency component to a threshold. The threshold may be determined based on one or more user-defined criteria. For example, the user may specify a desired duty cycle, e.g., D=30%. The threshold (T) may then be determined by multiplying the desired duty cycle by the amplifier drain voltage $V_{dd}$, e.g., $T=D \times V_{dd}$. It will be appreciated that the duty cycle controller 110 may determine the threshold. Alternatively, a controller external to the duty cycle controller 110 and/or amplification unit 100 (not shown) may determine the threshold. The duty cycle controller 110 adjusts one or more of the capacitance values of the variable capacitors 118 based on the comparison to control the delay, and therefore to control the duty cycle.

Figure 9:
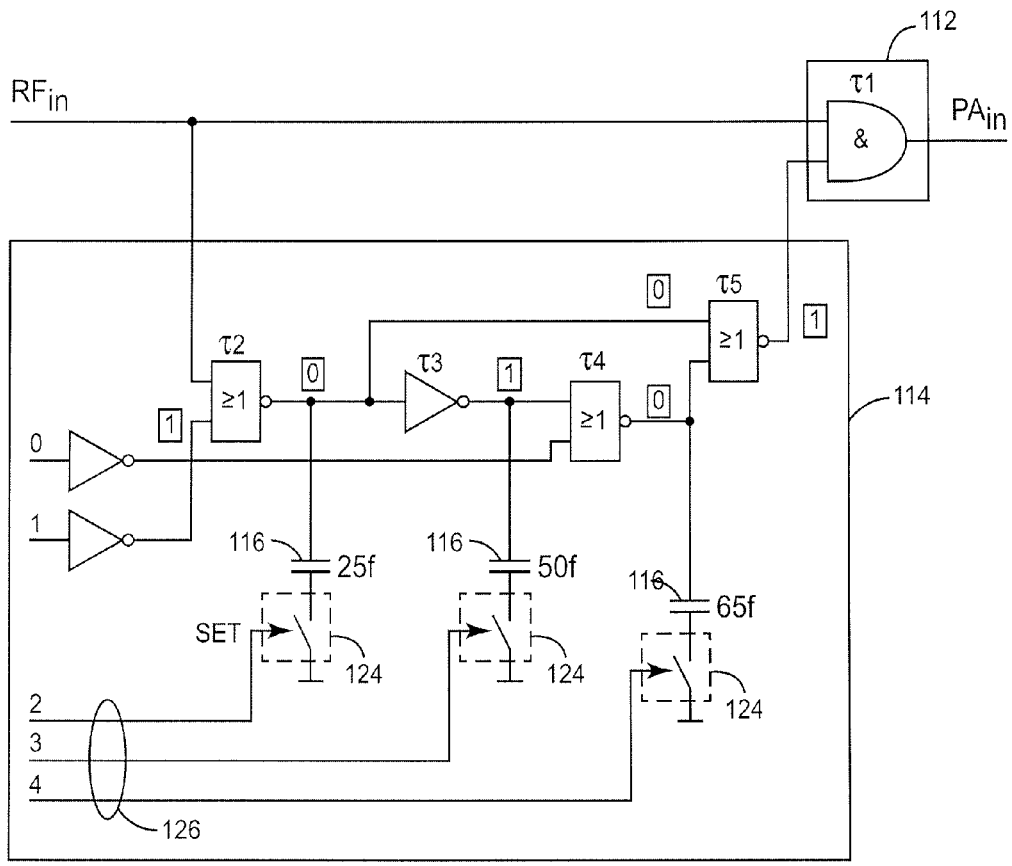
FIG. 9 is a circuit diagram for a duty cycle controller according to another exemplary embodiment.

FIG. 9 shows another variable duty cycle controller 110. In this embodiment, the variable delay unit 114 uses fixed capacitors 116, one or more of which are coupled to a switch 124. The switches 124 open or close responsive to a control signal applied to control lines 126 to impart the desired analog delay on the input digital signal, as shown by the truth table in FIG. 9. In particular, the delay circuit 114 comprises multiple inverters ($\tau 2$, $\tau 3$, $\tau 4$, $\tau 5$) and switched capacitors 116. The input signal $RF_{in}$ is delayed in the delay circuit 114 by the amount controlled by the control signal. The control signal may, e.g., be derived based on a threshold comparison, such as described with the embodiment of FIG. 8. The delayed digital signal $RF_{del}$ is logically combined with $RF_{in}$ in the NAND logic gate 112, which results in the modified digital signal $PA_{in}$ having a duty cycle different from that of $RF_{in}$.

Figure 10:
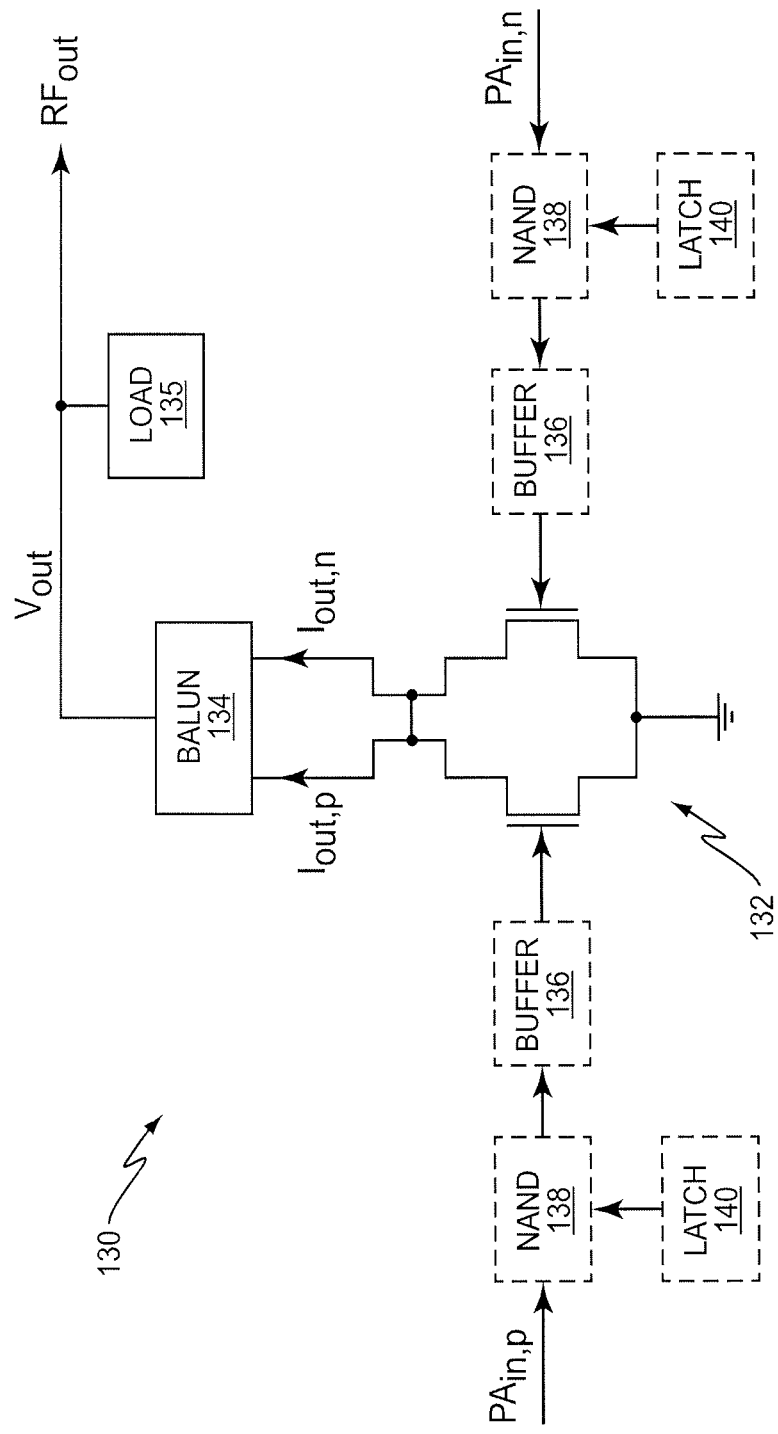
FIG. 10 is a circuit diagram for a last stage of an exemplary differential power amplifier.

The duty cycle control described herein may be applied to any digital signal before amplification in a digital power amplifier 130. FIG. 10 shows one exemplary digital power amplifier 130 comprising a differential amplifier 130 that may benefit from the duty cycle control described herein. Differential amplifier 130 comprises differentially connected transistors 132, a balun 134, and a load impedance 135. A digital input signal at the carrier radio frequency, e.g., an inverting modified digital signal $PA_{in,n}$ and a non-inverting modified digital signal $PA_{in,p}$, is applied to the respective inverting and non-inverting gates of the differentially connected transistors 132 to generate amplified analog inverting and non-inverting differential currents $I_{out,n}$ and $I_{out,p}$ at the carrier radio frequency. These currents respectively correspond to $PA_{out,n}$ and $PA_{out,p}$ discussed above. Balun 134 combines the differential amplified analog currents $I_{out,p}$ and $I_{out,n}$ to generate a single-ended analog voltage signal $V_{out}$, which corresponds to the RF output signal $RF_{out}$ to be transmitted over a wireless channel by an antenna (not shown). Load impedance 135 may comprise a fixed or variable load that is configured to match the amplifier impedance to that of the antenna. As discussed above, the load impedance 135 may further be controlled to provide any additional voltage adjustment as needed.

Differential power amplifier 130 may optionally include one or more serially connected buffers 136 coupled to the gates of the differentially connected transistors 132. In this case, the inverting and non-inverting modified digital signals $PA_{in,n}$ and $PA_{in,p}$ are applied to the inputs of the buffers 136 instead of directly to the gates of the differentially connected transistors 132. Buffers 136 may comprise digital inverters adjusted for speed. Because each buffer 136 inverts the applied signal, the number of buffers 136 impacts the duty cycle control described herein. Thus, connecting an odd number of buffers 136 between the duty cycle controller 110 and the transistor gates inverts the duty cycle of the modified digital signal output by the duty cycle controller 110, while connecting an even number of buffers 136 generally maintains the duty cycle of the modified digital signal output by the duty cycle controller 110 (with a small degradation, e.g., 5% to 10% of the duty cycle). Thus, to achieve a reduced duty cycle (e.g., less than 50%) at the inputs of the differentially connected transistors 132 relative to that of the input digital signal $RF_{in}$, buffer 136 comprises an even number of inverting buffers when the duty cycle controller 110 generates a modified digital signal $PA_{in}$ having a reduced duty cycle relative to that of $RF_{in}$, and comprises an odd number of inverting buffers when the duty cycle controller 110 generates a modified digital signal $PA_{in}$ having an increased duty cycle relative to that of $RF_{in}$.

In some embodiments, a single amplification unit 100 includes multiple cascaded differential amplifiers 130, where the signal output by each stage is a digital signal at the carrier radio frequency up until the very last differential amplifier stage (e.g., the differential amplifier of FIG. 10), and where the output power is set by the number of enabled stages. In this embodiment, each stage of the amplification unit 100 may further include NAND gates 138 and latches 140 that collectively control which stages are enabled. The NAND gates 138 drive the buffers 136 with a digital signal comprising the logical NAND combination of the modified digital signal and a latch code output by latch 140. The latch code controls how many stages are enabled, and thus how much output power is provided by the amplification unit 100.

Figure 11:
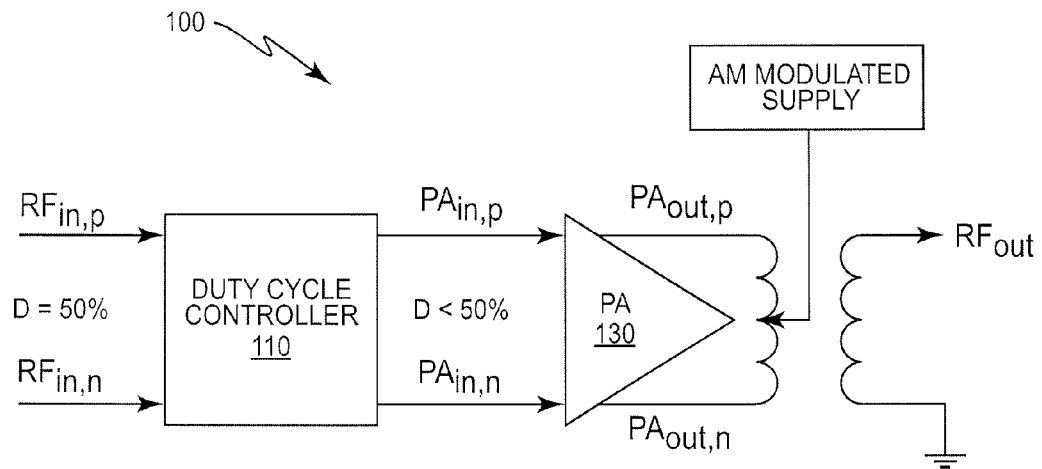
FIG. 11 is a block diagram of an amplification unit according to another exemplary embodiment.

In other embodiments, the differential amplifier 130 comprises a polar differential amplifier 130 having an amplitude modulated supply, as shown in FIG. 11. In this embodiment, only one differential amplifier 130 is needed, instead of multiple cascaded differential amplifiers as discussed above, removing the need for the latch-enable elements 138, 140. The polar differential amplifier 130 benefits from a reduced duty cycle in the same way as the cascaded amplifier, and therefore may use any of the above-described duty cycle control units 110. A typical application could be a GSM amplifier where the power ramp is purely provided via the supply. The advantage to this option is that the duty cycle can be controlled with minimal logic, which is a significant advantage even in light of the additional block necessary in the RF clock path.

Figure 12:
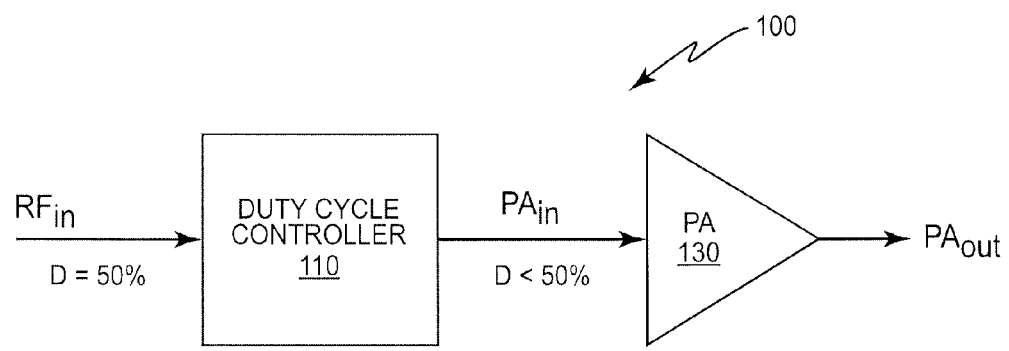
FIG. 12 is a block diagram of an amplification unit according to another exemplary embodiment.

While the above generally describes the invention in terms of a differential amplifier, it will be appreciated that the duty cycle control described herein may also be used to improve the efficiency of a single-ended amplifier, such as shown in FIG. 12. In this case, the duty cycle control generally improves the amplifier efficiency as shown in FIG. 3, which may push the single-ended amplifier into a higher amplifier class, e.g., class F.

Figure 13:
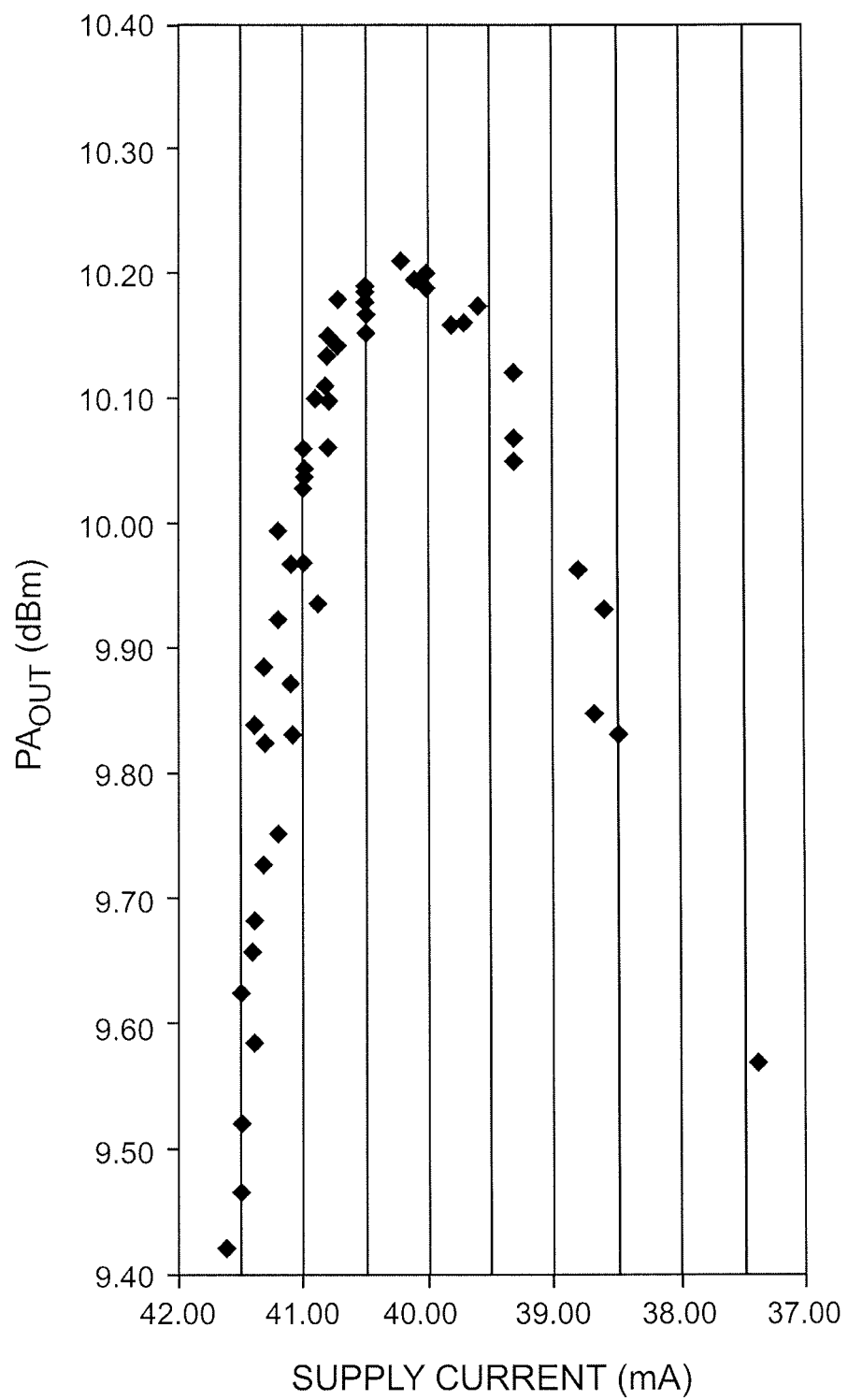
FIGS. 13 and 14 are graphs of measurement results for the exemplary duty cycle control described herein.
Figure 14:
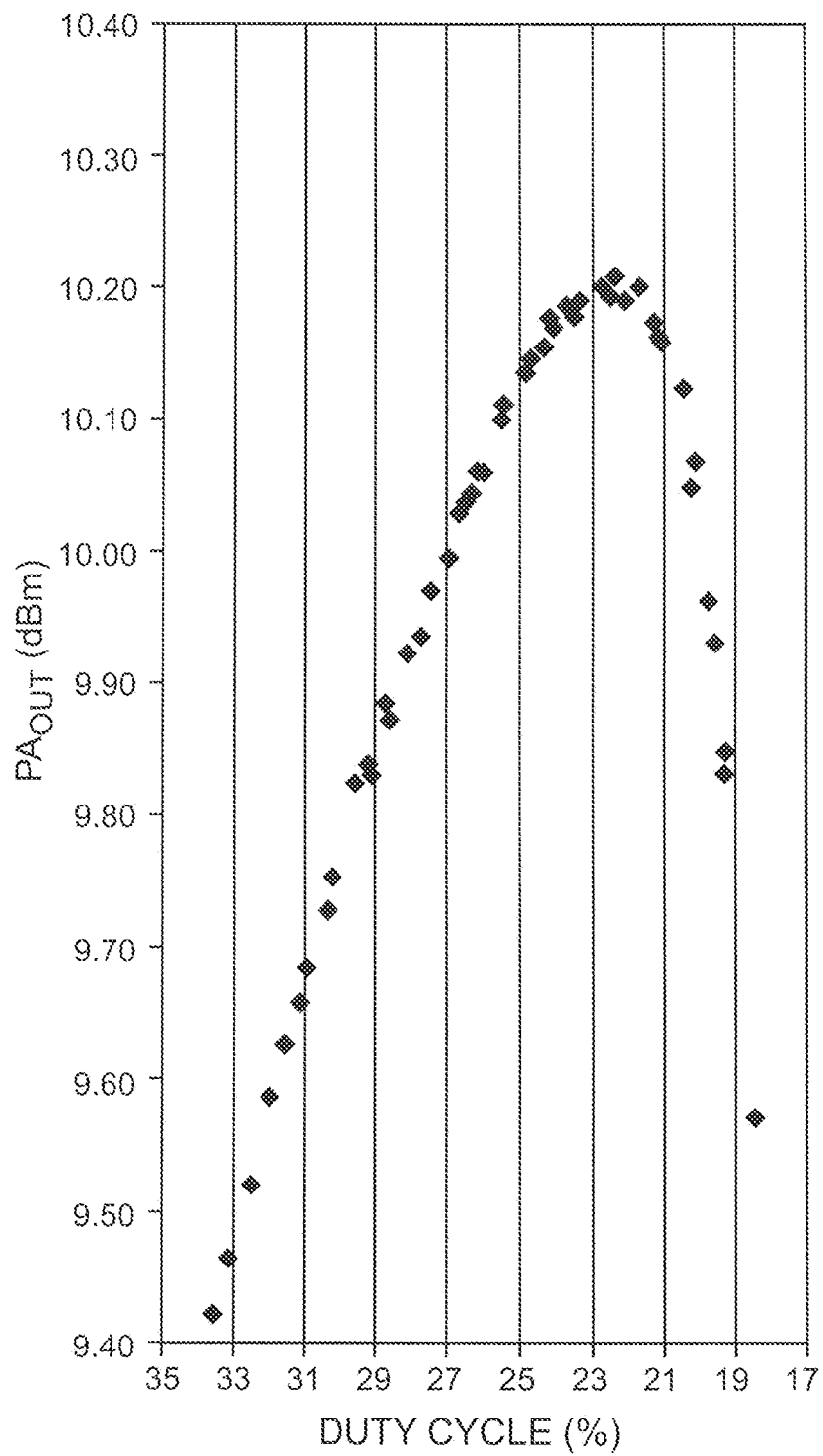

FIGS. 13 and 14 show typical measurements performed based on the duty cycle control described herein. FIG. 13 shows that increasing the supply current (with duty cycle control) beyond an optimum supply current actually reduces the output power. Thus, an optimum supply current, e.g., ~40 mA, provides an optimum output power, e.g., ~10.2 dBm. Further, FIG. 14 shows the optimum output power of 10.2 dBm may be achieved when the duty cycle of the modified digital input signal applied directly to the gates of the differentially connected transistors 132 is ~23%. Thus, a duty cycle of 23% for the amplification unit 100 provides an optimum output power with reduced current consumption.

The duty cycle control described herein advantageously improves the efficiency of a digital RF power amplifier without requiring frequency oversampling. Further, by digitally controlling an analog delay used to control the duty cycle in some embodiments, the present invention enables the duty cycle to be adjusted by steps as small as 1%-5%.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An RF amplification unit configured to generate an amplified analog signal at a carrier radio frequency for transmission over a wireless interface, the amplification unit comprising:
 a duty cycle controller configured to apply duty cycle control to an input digital signal at the carrier radio frequency to generate a modified digital signal at the carrier radio frequency, said modified digital signal having an adjusted duty cycle relative to that of the input digital signal, said duty cycle controller comprising:
  a variable delay unit operative to apply a variable analog delay to the input digital signal to generate a delayed signal at the carrier radio frequency, wherein the variable delay unit includes a detector to detect a low frequency component of the modified digital signal and a comparator to compare the low frequency component with a threshold, and wherein the variable delay unit digitally controls the variable analog delay applied to the input digital signal based on the comparison; and
  a logic gate operative to logically combine the input digital signal with the delayed signal to generate the modified digital signal; and
 a digital power amplifier configured to operate with improved efficiency by amplifying the modified digital signal to generate the amplified analog signal.

2. The amplification unit of claim 1 wherein the digital power amplifier comprises a differential power amplifier, wherein the duty cycle controller is configured to apply the duty cycle control to inverting and non-inverting input digital signals to respectively generate inverting and non-inverting modified digital signals having the same adjusted duty cycle.

3. The amplification unit of claim 2 wherein the differential power amplifier amplifies the inverting and non-inverting modified digital signals to respectively generate inverting and non-inverting amplified analog signals having substantially similar rise and fall times.

4. The amplification unit of claim 1 wherein the duty cycle of the modified digital signal is less than that of the input digital signal.

5. The amplification unit of claim 4 wherein the digital power amplifier further comprises an even number of inverting buffers.

6. The amplification unit of claim 4 wherein the duty cycle of the modified digital signal is between 20% and 30%.

7. The amplification unit of claim 1 wherein the duty cycle of the modified digital signal is greater than that of the input digital signal, wherein the digital power amplifier further comprises an odd number of inverting buffers to invert the duty cycle of the modified digital signal to less than that of the input digital signal before said modified digital signal is amplified to generate the amplified analog signal.

8. The amplification unit of claim 1 wherein the duty cycle controller is configured to adjust the duty cycle in 1% or 5% increments.

9. The amplification unit of claim 1 wherein the carrier radio frequency is greater than or equal to 2.5 GHz.

10. The amplification unit of claim 1 wherein the digital power amplifier further comprises a variable impedance load configured to adjust an output power of the amplified analog signal based on the duty cycle control.

11. A method of improving an efficiency of a digital power amplifier configured to generate an amplified analog signal at a carrier radio frequency for transmission over a wireless interface, the method comprising:
 applying a variable analog delay to an input digital signal at the carrier radio frequency to generate a delayed signal at the carrier radio frequency;
 detecting a low frequency component of the modified digital signal;
 comparing the low frequency component with a threshold;
 digitally controlling the variable analog delay based on the comparison;
 logically combining the input digital signal with the delayed signal to generate a modified digital signal at the carrier radio frequency, said modified digital signal having a different duty cycle than that of the input digital signal; and
 increasing an efficiency of the digital power amplifier by amplifying the modified digital signal in the digital power amplifier to generate the amplified analog signal at an output of the digital power amplifier.

12. The method of claim 11 wherein the digital power amplifier comprises a differential power amplifier,
 wherein applying the variable analog delay to the input digital signal comprises applying the same delay to inverting and non-inverting input digital signals at the carrier radio frequency to generate delayed inverting and non-inverting signals at the carrier frequency, and
 wherein logically combining the input digital signal and the delayed signal comprises logically combining the inverting input digital signal with the delayed inverting signal and logically combining the non-inverting input digital signal with the delayed non-inverting signal to respectively generate inverting and non-inverting modified digital signals at the carrier radio frequency, said inverting and non-inverting modified digital signals having the same duty cycle.

13. The method of claim 12 wherein amplifying the modified digital signal comprises amplifying the inverting and non-inverting modified digital signals in the differential power amplifier to generate inverting and non-inverting amplified analog signals having substantially similar rise and fall times.

14. The method of claim 11 wherein the duty cycle of the modified digital signal is less than that of the input digital signal.

15. The method of claim 14 further comprising applying the modified digital signal to an even number of inverting buffers in the digital power amplifier to invert the duty cycle of the modified digital signal an even number of times before amplifying the modified digital signal.

16. The method of claim 11 wherein the duty cycle of the modified digital signal is greater than that of the input digital signal, the method further comprising applying the modified digital signal to an odd number of inverting buffers in the digital power amplifier to invert the duty cycle of the modified digital signal an odd number of times before amplifying the modified digital signal.

17. The method of claim 11 further comprising controlling a variable impedance load based on the duty cycle control to adjust an output power of the amplified analog signal.

* * * * *

UNITED STATES PATENT AND TRADEMARK OFFICE
CERTIFICATE OF CORRECTION

| | | |
|---|---|---|
| PATENT NO. | : 8,699,619 B2 | Page 1 of 1 |
| APPLICATION NO. | : 12/941216 | |
| DATED | : April 15, 2014 | |
| INVENTOR(S) | : Visser et al. | |

It is certified that error appears in the above-identified patent and that said Letters Patent is hereby corrected as shown below:

In the specification

In Column 2, Lines 56-57, delete "RFin and RFdel" and insert -- $RF_{in}$ and $RF_{del}$ --, therefor.

In Column 2, Line 61, delete "$PA_{in}$," and insert -- $PA_{in}$ --, therefor.

In Column 2, Line 62, delete "frequency." and insert -- frequency --, therefor.

In Column 3, Line 7, delete "$PA_{in}$," and insert -- $PA_{in}$ --, therefor.

In Column 4, Line 24, delete "RF," and insert -- $RF_{in}$ --, therefor.

Signed and Sealed this
Twelfth Day of April, 2016

Michelle K. Lee
*Director of the United States Patent and Trademark Office*